(12) United States Patent
Sugiyama et al.

(10) Patent No.: US 7,521,656 B2
(45) Date of Patent: *Apr. 21, 2009

(54) SOLID-STATE IMAGE PICKUP APPARATUS AND CONTROL METHOD THEREOF

(75) Inventors: Toshinobu Sugiyama, Kanagawa (JP); Shinichi Yoshimura, Tokyo (JP); Ryoji Suzuki, Kanagawa (JP); Kazuhiro Hoshino, Kanagawa (JP)

(73) Assignee: Sony Corporation, Tokyo (JP)

( * ) Notice: Subject to any disclaimer, the term of this patent is extended or adjusted under 35 U.S.C. 154(b) by 911 days.

This patent is subject to a terminal disclaimer.

(21) Appl. No.: 11/106,302

(22) Filed: Apr. 13, 2005

(65) Prior Publication Data

US 2005/0174612 A1     Aug. 11, 2005

Related U.S. Application Data

(63) Continuation of application No. 11/053,626, filed on Feb. 8, 2005, which is a continuation of application No. 10/245,966, filed on Sep. 18, 2002, now Pat. No. 6,858,827.

(30) Foreign Application Priority Data

Sep. 20, 2001  (JP) ............................ 2001-287625
Jun. 11, 2002  (JP) ............................ 2002-169577

(51) Int. Cl.
    *H01L 27/00* (2006.01)
(52) U.S. Cl. ................. 250/208.1; 348/302; 250/214 R

(58) Field of Classification Search ............. 250/214 R, 250/208.1, 201.9; 348/302–310; 257/433
See application file for complete search history.

(56) References Cited

U.S. PATENT DOCUMENTS

| | | | |
|---|---|---|---|
| 4,974,093 A | | 11/1990 | Murayama et al. |
| 5,148,013 A | * | 9/1992 | Yamada .................... 250/208.1 |
| 5,291,294 A | * | 3/1994 | Hirota ........................ 348/316 |
| 6,452,149 B1 | | 9/2002 | Yamashita et al. |
| 6,542,192 B2 | | 4/2003 | Akiyama et al. |
| 6,563,540 B2 | | 5/2003 | Trevino et al. |
| 6,858,827 B2 | * | 2/2005 | Sugiyama et al. ......... 250/208.1 |

* cited by examiner

*Primary Examiner*—Georgia Y Epps
*Assistant Examiner*—Tony Ko
(74) *Attorney, Agent, or Firm*—Robert J. Depke; Rockey, Depke & Lyons, LLC.

(57) ABSTRACT

An arithmetic circuit, which is retained by each pixel in a conventional image sensor, is shared by each column. Signal processing circuits of different configurations are provided on signal transmission paths in an upward direction and a downward direction of a vertical signal line for extracting an image signal from each pixel, whereby image output processing and arithmetic processing are performed completely separately by the different circuit blocks. Thus, image quality of an actual image is improved and optimum design for arithmetic processing is made possible. Specifically, an I-V converter circuit unit, a CDS circuit unit and the like are provided on the image output side. A current mirror circuit unit, an analog memory array unit, a comparator unit, a bias circuit unit, a data latch unit, an output data bus unit and the like are provided on the arithmetic processing side.

20 Claims, 11 Drawing Sheets

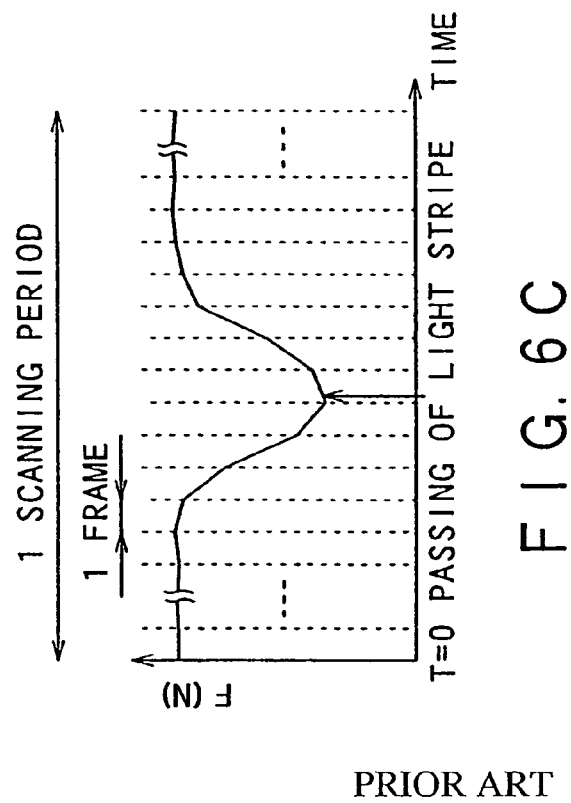
FIG. 6A
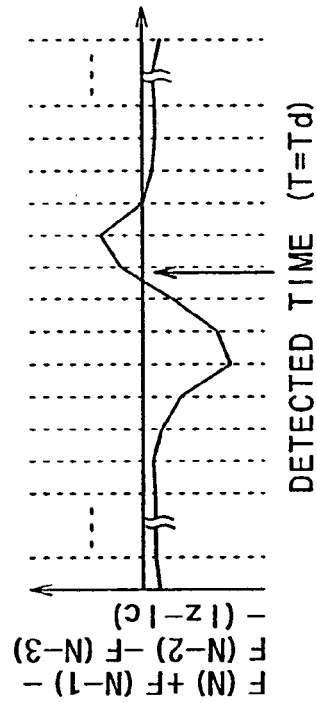
FIG. 6B
FIG. 6C
PRIOR ART
PRINCIPLES OF TRIANGLATION METHOD AND LIGHT STRIPE DETECTING METHOD

PRIOR ART

RANGE MEASUREMENT TIMING CHART

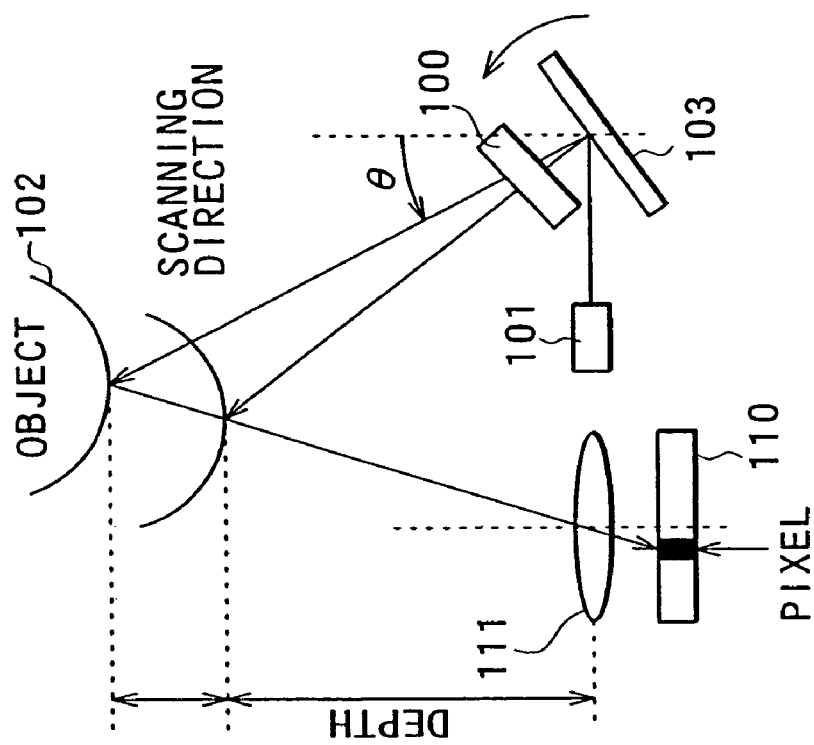
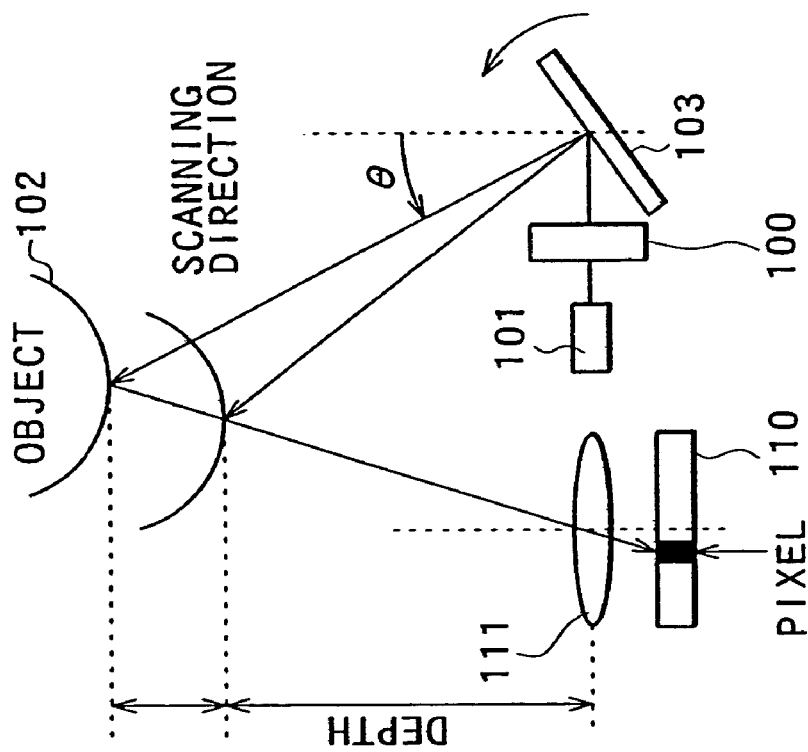

SOLID-STATE IMAGE PICKUP APPARATUS AND CONTROL METHOD THEREOF

The subject matter of application Ser. No. 11/053,626 is incorporated herein by reference. The present application is a continuation of U.S. application Ser. No. 11/053,626, filed Feb. 8, 2005, which is a continuation of U.S. application Ser. No. 10/245,966, filed Sep. 18, 2002, now U.S. Pat. No. 6,858,827 which claims priority to Japanese Patent Application Nos. JP2001-287,625, filed Sep. 20, 2001, and JP2002-169577, filed Jun. 11, 2002. The present application claims priority to these previously filed applications.

BACKGROUND OF THE INVENTION

The present invention relates to a solid-state image pickup apparatus and a control method thereof having a function of obtaining a normal image signal and additionally a computational function for executing various applications.

Recently, solid-state image pickup apparatus have been proposed which image sensors have a function of performing various operations on image information and thereby realize an increase in the speed of image processing and the like.

As one of such image sensors, a sensor having a function of obtaining a normal actual image, a function of three-dimensional range calculation, and a function of detecting a moving object has been proposed (see ISSCC/2001/SESSION6/CMOS IMAGE SENSORS WITH EMBEDDED PROCESSORS/6.4 (2001IEEE International Solid-State Circuits Conference) and Japanese Patent Application No. 2000-107723, for example; in the following description, the former will be described as first conventional literature, and the latter will be described as second conventional literature).

The image sensor has therein a circuit for obtaining an image, which circuit is the same as in an ordinary image sensor, and additionally a function of detecting temporal change in intensity of light. As a concrete architecture, an image sensor in which each pixel has the computational function has already been reported.

Various image processing is realized by using the computational function of such an image sensor. Principles of three-dimensional measurement, which is typical of the various image processing operations, will be described in the following.

FIGS. 6A, 6B, and 6C are diagrams of assistance in explaining principles of a triangulation method and a light stripe detecting method for three-dimensional measurement.

As shown in FIG. 6A, in the triangulation method, a sensor 2 and a light source 3 are disposed at a distance from an object 1 of range measurement. The light source 3 is intended to irradiate the object 1 with a stripe of light, and is provided with a scanner (scanning mirror) 4 for reflecting the stripe of light.

With such an arrangement, the scanner 4 repeats an operation of scanning the stripe of light of the light source 3 from the right to the left, for example.

As shown in FIG. 6B, while the stripe of light of the light source 3 is scanned from the right to the left once, a few thousand to a few ten thousand frames are scanned in the sensor 2. Each imaging pixel in the sensor 2 outputs data indicating that the stripe of light reflected by the object 1 is detected, at the time of the detection.

Directing attention to one pixel, a distance between the object 1 and the sensor 2 in a direction of a line of sight of the pixel and a swing angle of the scanner 4 at the time of the detection of the reflected light are uniquely determined. Specifically, when scanning of the scanner 4 and counting the number of frames of the sensor 2 are started at the same time, the swing angle of the scanner 4 is determined by knowing a frame count at which the stripe of light is detected, whereby the distance between the object 1 and the sensor 2 is determined.

In an actual image sensor, the frame count and distance are corrected in advance by an object for distance correction, and resulting data is retained as a table on the system side. Thus, high-precision absolute measurement of distance is made possible.

A function required of the image sensor in the triangulation method as described above is high-sensitivity detection of the stripe of light.

Infrared light is generally used for wavelength of the light. However, reflectance of the infrared light differs depending on the measured object. Thus, for measurement of even an object having a texture of low reflectance, accuracy in detecting passage of the stripe of light needs to be increased.

In the first conventional literature, light signal computation is performed in each pixel for the high-sensitivity detection. An architecture for this will be described in the following.

FIG. 7 is a block diagram showing a general configuration of an image sensor in the first and second conventional literature. FIG. 8 is a circuit diagram showing an internal configuration of one pixel in the image sensor shown in FIG. 7.

In FIG. 7, an imaging unit 10 for imaging a subject is provided therein with a large number of pixels 11 each forming a photosensor which pixels are disposed in a matrix manner, vertical signal lines 12 for selecting each of the pixels 11 and extracting an imaging signal from each column, and the like.

The imaging unit 10 has exteriorly thereof: a V scanner unit 13 for scanning the pixels 11 for extracting imaging signals in a vertical direction through selecting lines; a signal generating unit 14 for outputting a control signal to the V scanner unit 13; and output circuit units 15 for receiving output signals of columns #1 to #192 from the vertical signal lines 12, performing necessary signal processing, and outputting the result as image signals of the columns.

In FIG. 8, each of the pixels 11 includes: a photodiode (PD) 21 for receiving light; an amplifying transistor (QA) 22 for passing a current according to intensity of the light; a current mirror circuit 23 for amplifying the current; a current copier circuit (frame memories) 24 for storing the current signal; a two-step chopper comparator 26 for comparing currents from the current copier circuit 24 with each other; and a bias circuit (offset generator) 27 for applying a bias to the currents.

A unit for reading signal charge from the PD 21 in the pixel 11 includes: a floating diffusion (FD) part 31 for extracting the signal charge from the PD 21; a transfer transistor 32 for transferring the signal charge from the PD 21 to the FD part 31; a reset transistor 34 for resetting the FD part 31; the above-mentioned amplifying transistor 22 for converting the signal charge from the FD part 31 into a voltage signal and amplifying the voltage signal; the above-mentioned current mirror circuit 23 for amplifying an output current of the amplifying transistor 22; and a switch (SA) 33 for controlling output timing.

The current copier circuit 24 has four circuits (M1 to M4) set in parallel with each other. The circuits each function as a frame memory, and are capable of storing light signals for a total of four frames.

FIG. 9 is a timing chart of range measurement operation by the image sensor.

During one scan period in which the laser scans once, operation for a few thousand to a few ten thousand frames is performed in the image sensor. One scan period in this case is generally adjusted to a video frame rate when range information is imaged on the monitor, and is about 33 msec.

In the following description, to be differentiated from the video frame rate, a scan of one frame within the image sensor will be referred to as a sensor frame.

At a start of a sensor frame (1 frame in FIG. 9), a reset signal (RST) and a charge transfer signal (TX) of the FD part 31 in each pixel cause a charge accumulated by a light signal to be transferred to the FD part 31, that is, a gate of the amplifying transistor (QA) 22.

Thereafter, pixels on each line in a row direction of the image sensor are selected, and an operation of storing a signal in the current copier circuit 24 ($\phi1$) and reading operations ($\phi2$ and $\phi3$) are performed.

In the storing operation $\phi1$, a detection signal is stored in one frame memory. The storing frame memory is changed sequentially with each change of frames (frame index: A, B, C, D).

In the reading operations $\phi2$ and $\phi3$, memories of first two frames and memories of second two frames are each added together, and then compared by the comparator 26, whereby the following operation is made possible:

$$f(k)+f(k-1)-(f(k-2)+f(k-3))-(Iz-Ic) \quad \text{(Equation 1)}$$

where the last Iz and Ic refer to bias currents of the bias circuit 27 and correspond to currents in the periods $\phi2$ and $\phi3$, respectively, with (Iz−Ic)>0 in normal settings.

When no stripe of light is detected, no temporal difference occurs in intensity of light detected in each pixel, and therefore a calculation up to the fourth term of the equation 1 is zero. Thus, only the bias portion is left to provide a negative value. The negative value is outputted as low data by the comparator 26.

When a stripe of light passes the pixel, on the other hand, there always occurs a time region where data of an addition of first two frames becomes greater than data of an addition of second two frames (FIG. 6C). When a difference between the data of the addition of the first two frames and the data of the addition of the second two frames exceeds the set bias (Iz−Ic), the operation of the equation 1 results in a positive value. Thus, directing attention to a certain pixel, the comparator 26 outputs low data during a normal time, and outputs high data when a stripe of light passes.

Therefore, when a frame count at which the comparator 26 outputs high data is recorded for each pixel on the system side, a distance to each point can be uniquely measured by triangulation from a relation of the count and the angle of the light scanner.

The image sensor described above can also output a normal image by performing A/D conversion processing within the pixels.

In this case, a reference signal is stored in one of the frame memories M1 to M4. Then, each time a sensor frame is scanned, a light signal charge is accumulated by integration in the FD part 31 in the pixel, then stored in the other of the frame memories M1 to M4, and compared in magnitude with the reference level by the comparator 26.

The reference level is exceeded by charge accumulation by a small number of frame scans when the pixel has a high light intensity, whereas a large number of frame operations are required when the pixel has a low light intensity. Thus, as in range measurement, when a frame count at which the data of the comparator 26 is inverted is stored on the system side, the frame count corresponds to an actual image, which can be then shown on the monitor.

However, since the image sensor as described above retains the computational circuit in each of the pixels, the pixels have a large size, and therefore it is difficult to reduce size of the sensor and increase the number of pixels of the sensor.

In addition, the large circuit scale results in a high power consumption by the chip, specifically a power consumption of 1 W or more according to the first conventional literature, for example.

Such an image sensor is usable in a relatively large system with a sufficient disposing space and high power capacity, but is not suitable for consumer applications and the like requiring a reduction in power consumption, a reduction in cost, and an increase in the number of pixels of an actual image.

Furthermore, as in the case of an ordinary imager, there is a tendency to require a high-quality color image as the actual image in consumer applications.

SUMMARY OF THE INVENTION

It is accordingly an object of the present invention to provide a solid-state image pickup apparatus and a control method that can enhance both a function of obtaining a normal actual image and a computational function for executing various applications without complicating a configuration within each pixel and thereby achieve a reduction in size, power consumption, and cost, an increase in the number of pixels (higher picture quality) of an actual image and the like.

In order to achieve the above object, according to the present invention, there is provided a solid-state image pickup apparatus including: a plurality of light receiving units each forming an imaging pixel; a plurality of photoelectric conversion units for converting light received by the light receiving units into electric signals; a signal line having a plurality of signal transmission directions for extracting the electric signals converted by the plurality of photoelectric conversion units; a first signal processing unit for processing the electric signals transmitted in a first signal transmitting direction through the signal line; and a second signal processing unit for processing the electric signals transmitted in a second signal transmitting direction through the signal line; wherein the signal processing performed by the first signal processing unit and the signal processing performed by the second signal processing unit are different from each other.

With the solid-state image pickup apparatus according to the present invention, the image signals obtained by the imaging pixels are transmitted in the first signal transmitting direction and the second signal transmitting direction through the signal line, and the first signal processing unit and the second signal processing unit perform signal processing operations different from each other. Thus, normal image signal output and various other arithmetic processing, for example, can be performed by separate circuits.

Therefore, circuit elements required for each of the signal processing operations are arranged together outside pixels, so that a configuration within each of the pixels can be simplified and minimized. Also, it is possible to enhance the function of obtaining a normal actual image and the computational function for executing various applications by their respective independent circuit configurations. It is thus possible to achieve smaller apparatus size, lower power consumption, lower cost, an increase in the number of pixels of an actual image (higher image quality) and the like.

BRIEF DESCRIPTION OF THE DRAWINGS

FIGS. 6A, 6B, and 6C are diagrams of assistance in explaining principles of a triangulation method and a light stripe detecting method for three-dimensional range measurement;

FIGS. 11A and 11B are diagrams of assistance in explaining configuration examples of a three-dimensional range measurement system according to a third embodiment of the present invention.

DETAILED DESCRIPTION OF PREFERRED EMBODIMENTS

A preferred embodiment of the present invention will next be described with reference to the drawings.

In a solid-state image pickup apparatus (hereinafter referred to as an image sensor or simply as a sensor) according to the present embodiment, an arithmetic circuit, which is retained by each pixel in the image sensor described in the conventional example, is shared by each column. The solid-state image pickup apparatus performs image output processing and arithmetic processing completely separately by different circuit blocks (a first signal processing unit and a second signal processing unit). The solid-state image pickup apparatus thereby achieves high image quality of an actual image and enables optimum design for arithmetic processing.

The image output processing and the arithmetic processing are selected by a selection signal from an exterior of the sensor. When one of the image output processing and the arithmetic processing is not performed, the sensor effects control to stop operation of part or the whole of the circuit block.

A method of scanning image outputs of the sensor and a method of arithmetic operation in image processing (applied to range measurement as an example, as in the conventional example) according to a concrete embodiment of the present invention will hereinafter be described.

Figure 1:
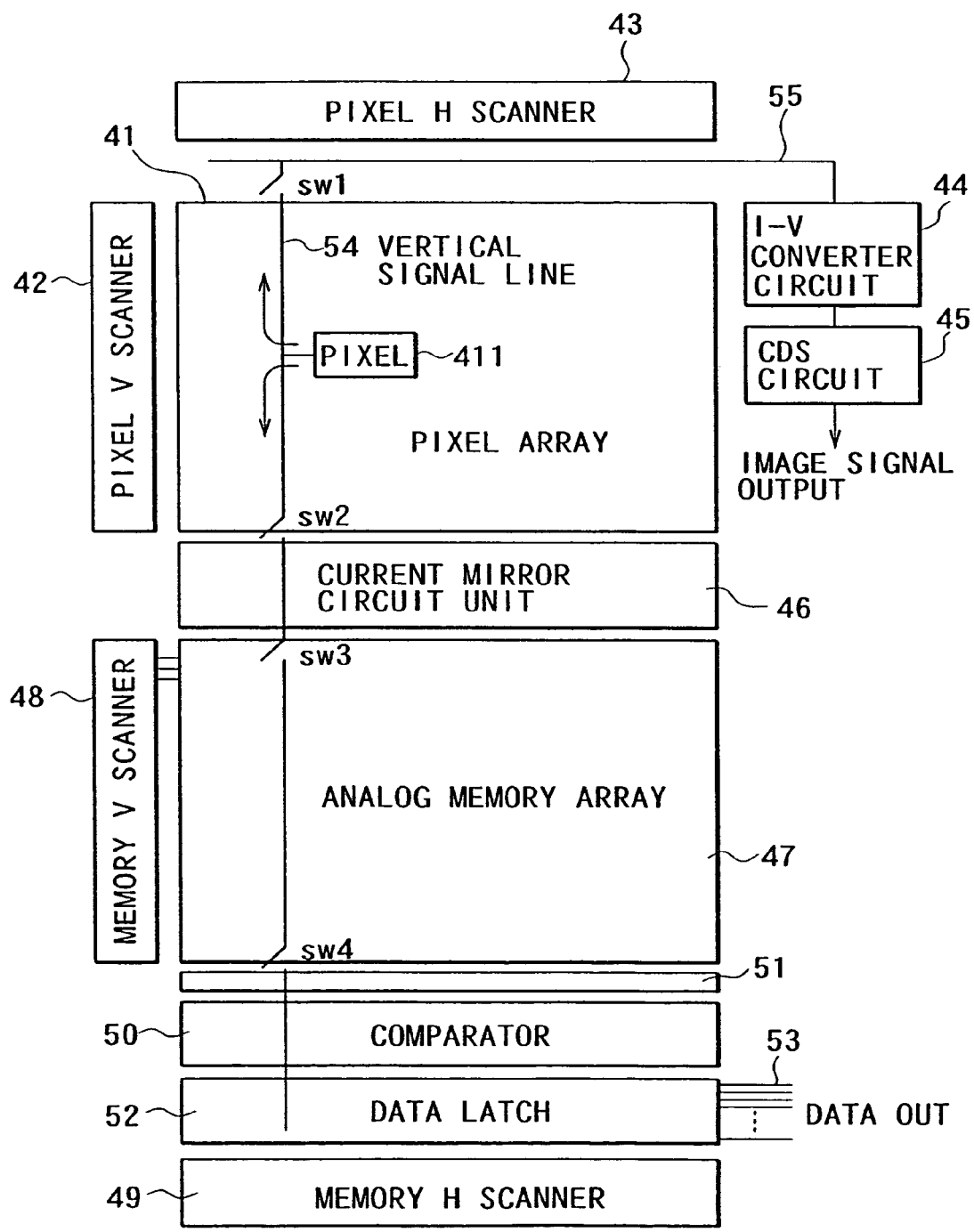
FIG. 1 is a plan view of a general configuration of an image sensor according to an embodiment of the present invention.

FIG. 1 is a plan view of a general configuration of an image sensor according to a first embodiment of the present invention.

As shown in FIG. 1, the image sensor includes a pixel array unit 41, a pixel V scanner unit 42, a pixel H scanner unit 43, an I-V converter circuit unit 44, a CDS circuit unit 45, a current mirror circuit unit 46, an analog memory array unit 47, a memory V scanner unit 48, a memory H scanner unit 49, a comparator unit 50, a bias circuit unit 51, a data latch unit 52, an output data bus unit 53 and the like.

The pixel array unit 41 is formed by arranging a plurality of pixels 411 for detecting light in a two-dimensional matrix form in a row direction and a column direction. A signal sent out from each of the pixels 411 is transmitted by a signal line (vertical signal line) 54 extending in a vertical direction.

The pixel V scanner unit 42 and the pixel H scanner unit 43 scan an interior of the pixel array unit 41 in the vertical direction and the horizontal direction to thereby select one of the pixels 411.

The I-V converter circuit unit 44 converts a current outputted from each of the pixels 411 to a horizontal signal line 55 at the time of normal image output scanning into a voltage signal. The CDS circuit unit 45 subjects the output signal from the I-V converter circuit unit 44 to predetermined noise rejection processing, and then outputs the result as an image signal.

The current mirror circuit unit 46 amplifies the output current from each of the pixels 411 at the time of arithmetic processing. The analog memory array unit 47 temporarily stores an output from the current mirror circuit unit 46 within a current copier cell.

The memory V scanner unit 48 and the memory H scanner unit 49 scan the current copier cell in the analog memory array unit 47 to extract data within the cell. The bias circuit unit 51 supplies a bias current to the current copier cell in the analog memory array unit 47.

The comparator unit 50 subjects the data read from the analog memory array unit 47 to a comparing operation. The data latch unit 52 latches operation data of the comparator unit 50, and outputs the latched data from the output data bus unit 53.

The vertical signal line 54 is provided with a switch SW1 for making and breaking connection between the pixel array unit 41 and the horizontal signal line 55, a switch SW2 for making and breaking connection between the pixel array unit 41 and the current mirror circuit unit 46, a switch SW3 for making and breaking connection between the current mirror circuit unit 46 and the analog memory array unit 47, and a switch SW4 for making and breaking connection between the analog memory array unit 47 and the bias circuit unit 51.

With such a configuration, at the time of normal image output scanning, the pixels 411 of the pixel array unit 41 are sequentially scanned by the pixel H scanner unit and the pixel V scanner unit to select one particular pixel 411. A current signal sent out from the pixel 411 is transmitted in an upward direction (first signal transmitting direction) in the figure. The pixel H scanner unit 43 sequentially selects the switch SW1. A signal from each pixel is thus transferred to the horizontal signal line. The signal is thereafter converted by the I-V converter circuit unit 44 into a voltage signal. Further, FPN (Fixed Pattern Noise) and reset noise (ktc noise) are removed from the voltage signal by the CDS circuit unit 45, and then the result is outputted as an image signal output.

Basically, a scanning procedure at the time of normal image output as described above is conventionally known (see ISSCC/2000/SESSION6/CMOS IMAGE SENSORS WITH EMBEDDED PROCESSORS/6.1 (2000IEEE International Solid-State Circuits Conference), for example) Therefore detailed description of the scanning procedure will be omitted.

At the time of such image output scanning, the switch SW2 of the vertical signal line 54 is turned off, whereby the pixel array unit 41 is cut off from the current mirror circuit unit 46.

On the other hand, at the time of range measurement, the switch SW1 is turned off, and the switch SW2 and the switch SW3 are turned on. The current signal is therefore transmitted to the current mirror circuit unit 46 disposed in a downward direction (second signal transmitting direction) in the figure of the vertical signal line 54.

At this time, the pixel V scanner unit 42 simultaneously selects all pixels in the same row of the pixel array unit 41, and therefore a signal from each column is simultaneously outputted in parallel (that is, column-parallel operation is performed).

The signal transmitted to the current mirror circuit unit 46 is thereafter retained within the analog memory array unit 47. Thereafter, data of each frame is compared by the comparator unit 50. A result of the comparison is latched by the data latch unit 52 and then outputted from the output data bus unit 53.

Figure 2:
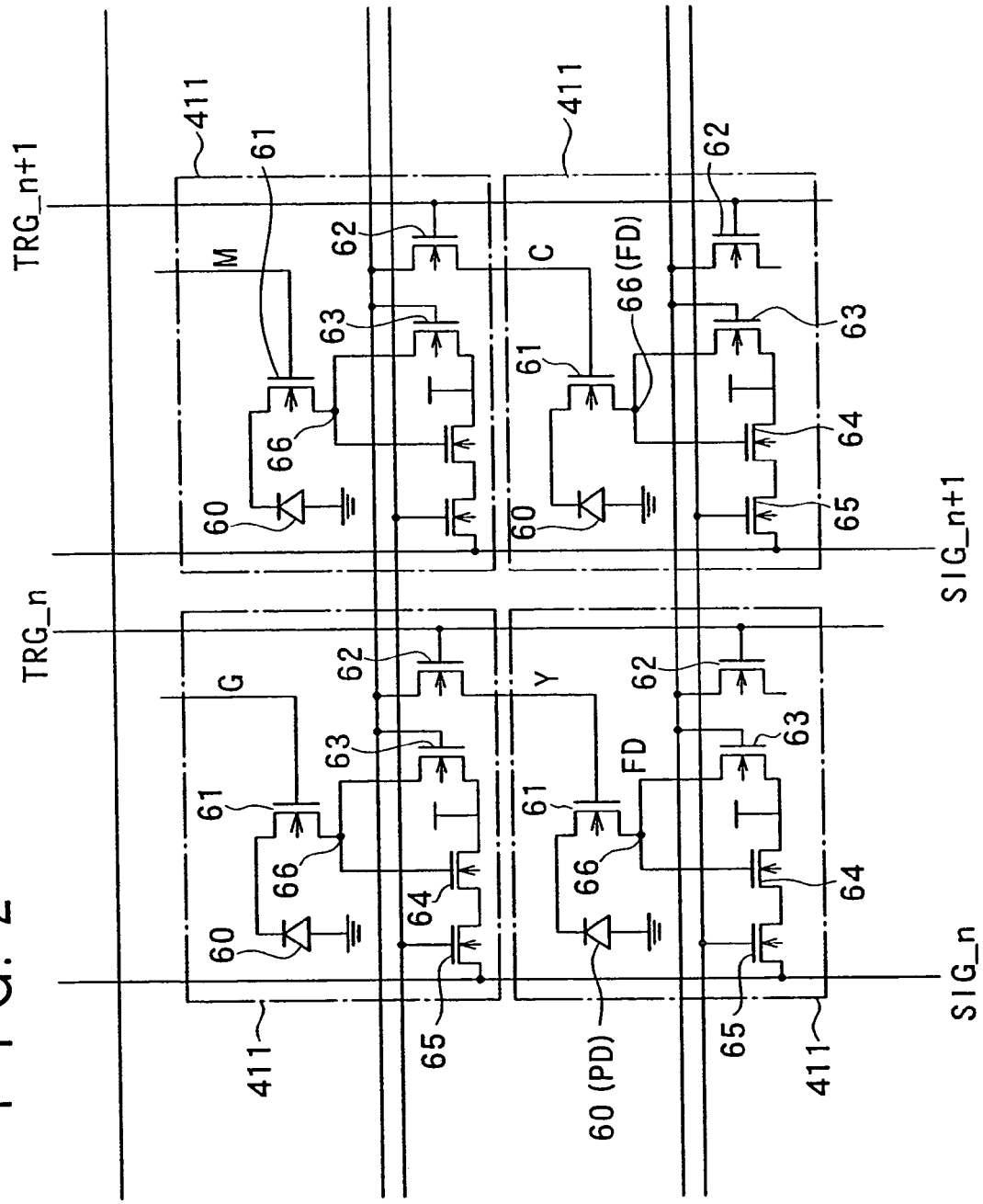
FIG. 2 is a block diagram showing an internal configuration of each of pixels of a pixel array unit in the image sensor shown in FIG. 1.

FIG. 2 is a block diagram showing an internal configuration of each of the pixels 411 forming the pixel array unit 41. FIG. 2 shows four pixels corresponding to four complementary colors Y, G, Cy, and Mg.

Each of the pixels 411 is formed with a photodiode (PD) 60 and five MOS transistors 61 to 65.

Light received by the PD 60 is converted into a charge, and the charge is transferred by a transfer transistor 61 to a floating diffusion (FD) part 66. The charge transferred to the FD part 66 determines gate potential of an amplifying transistor 64. A current corresponding to the gate potential passes through the amplifying transistor 64 and a selecting transistor 65, and is then transmitted to a vertical signal line (SIG_n) 54.

A reset transistor 63 is provided to reset the FD part 66 to a power supply voltage. A transfer selecting transistor 62 is provided to select a gate of the transfer transistor 61.

Signal timing at the time of image output and at the time of range measurement will be described in the following.

Figure 3:
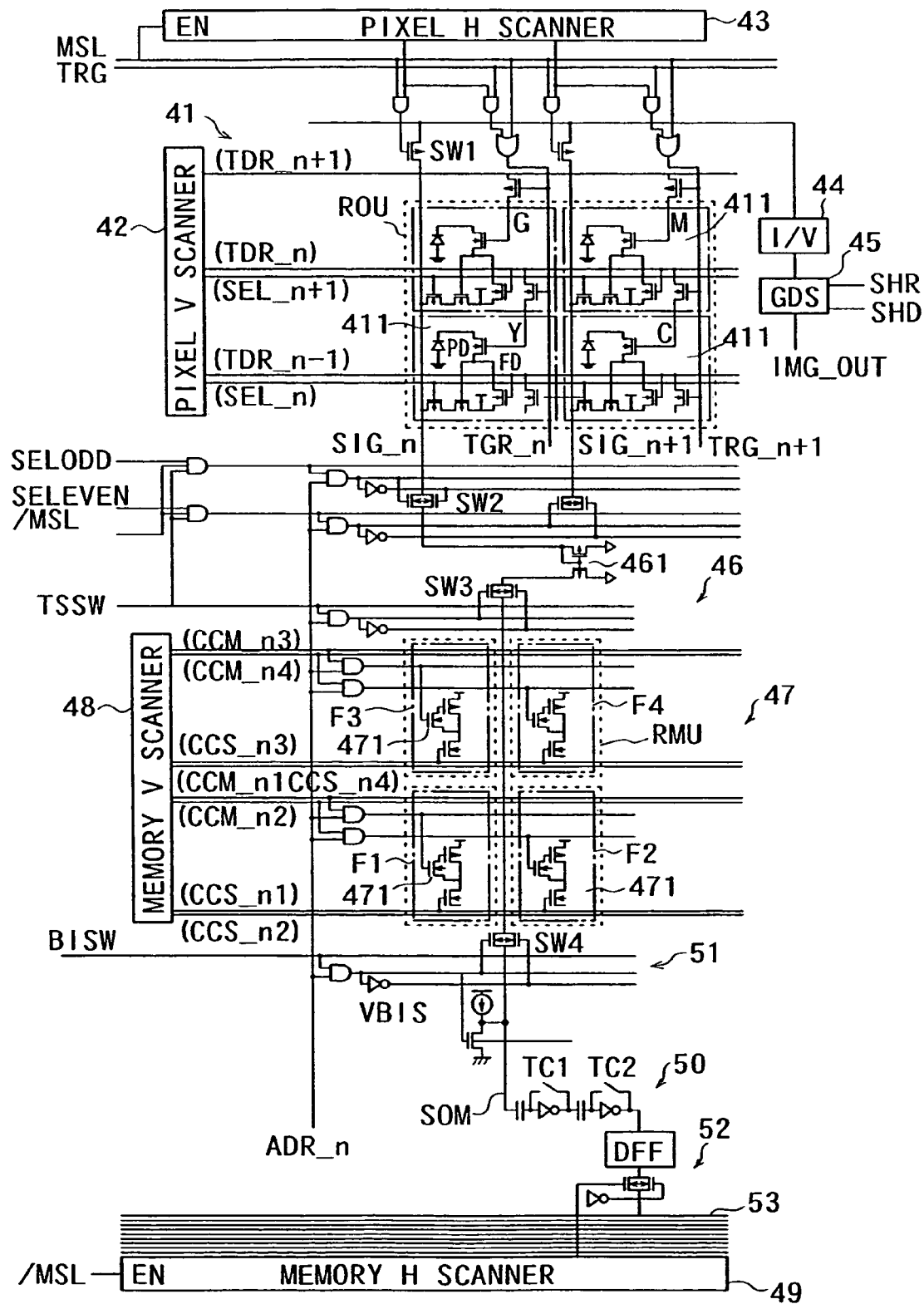
FIG. 3 is a block diagram showing details of each of blocks of the image sensor shown in FIG. 1.
Figure 4:
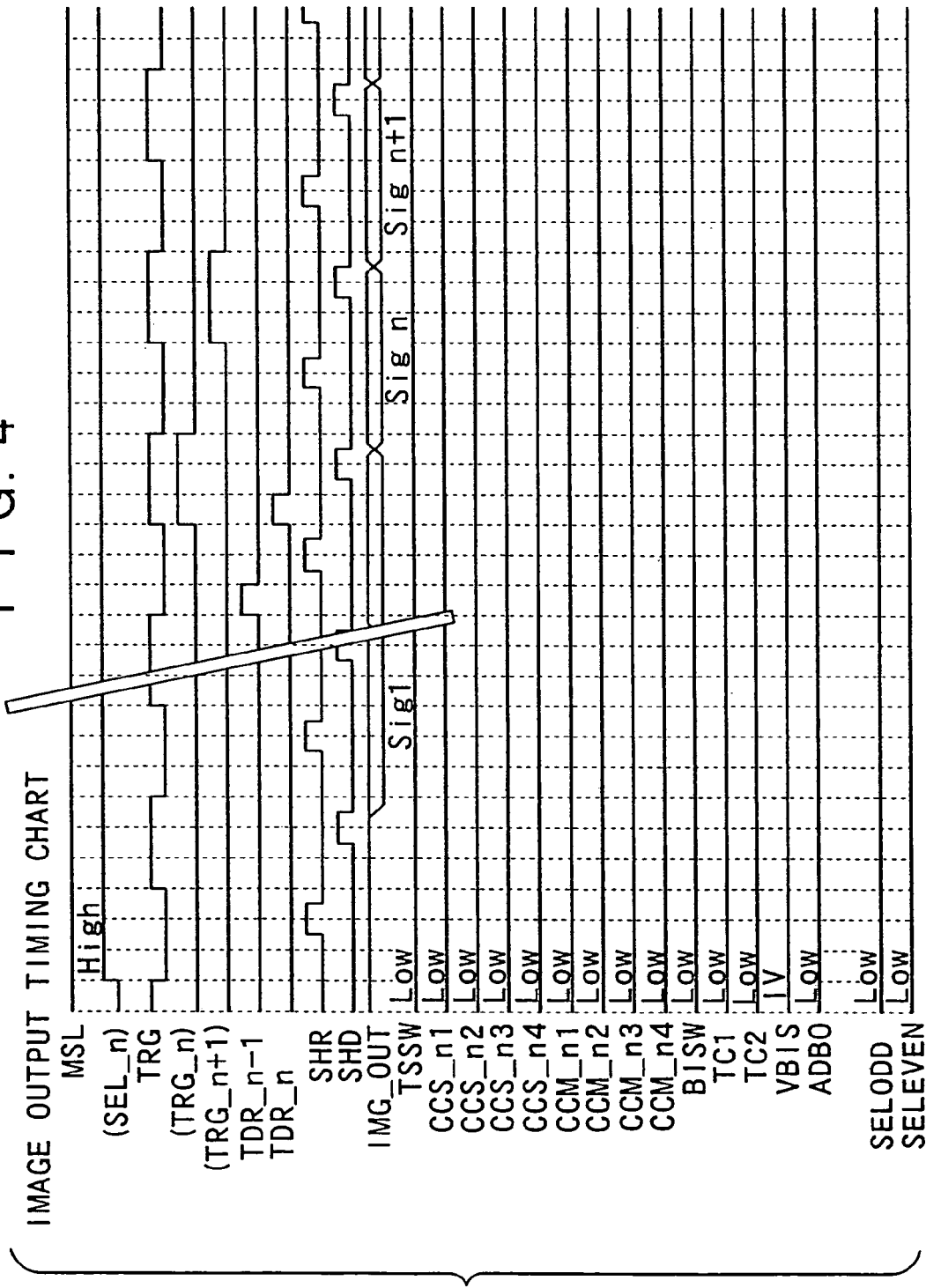
FIG. 4 is a timing chart of operation at the time of image output by the image sensor shown in FIG. 1.
Figure 5:
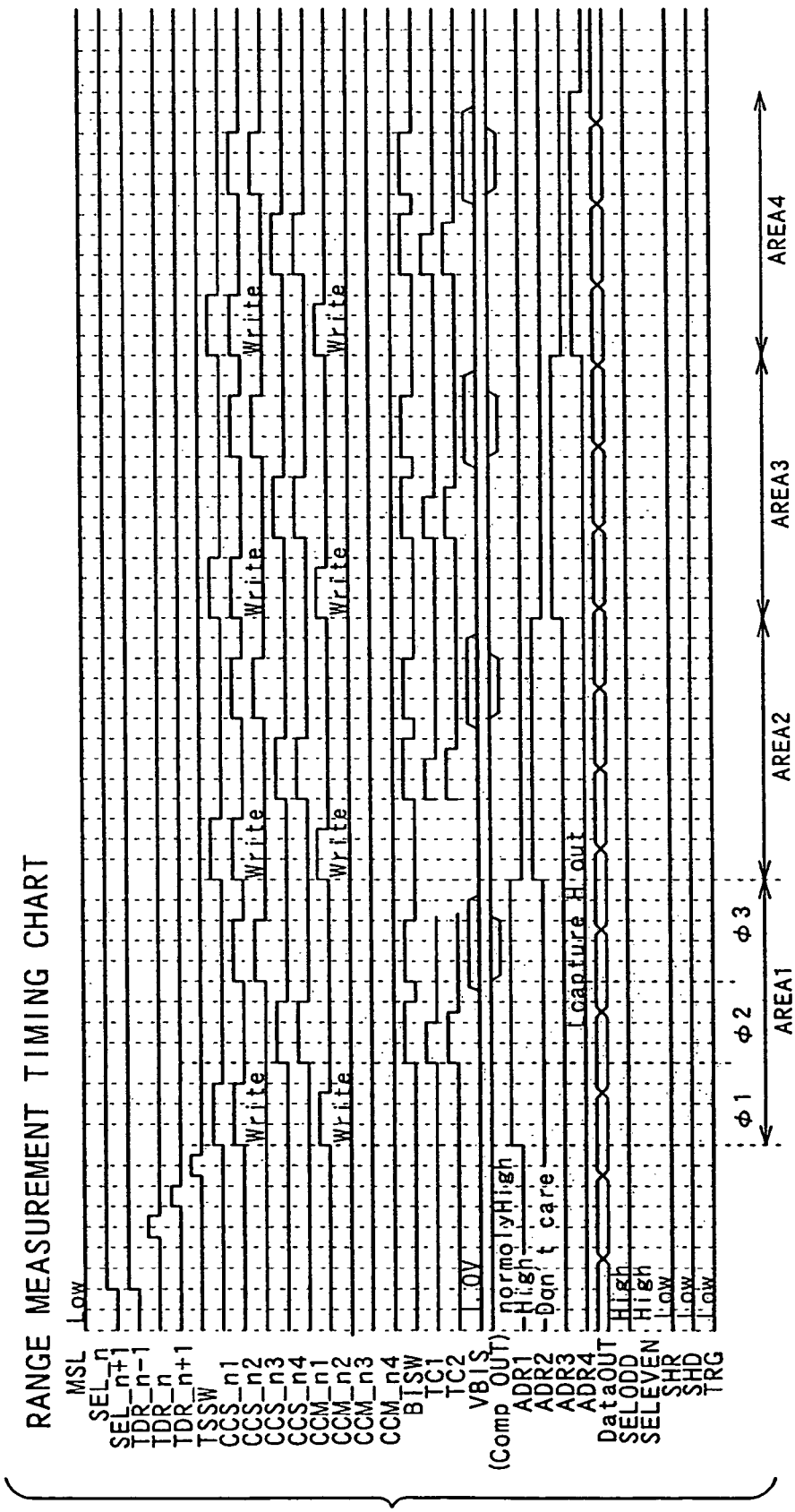
FIG. 5 is a timing chart of operation at the time of range measurement by the image sensor shown in FIG. 1.
Figure 7:
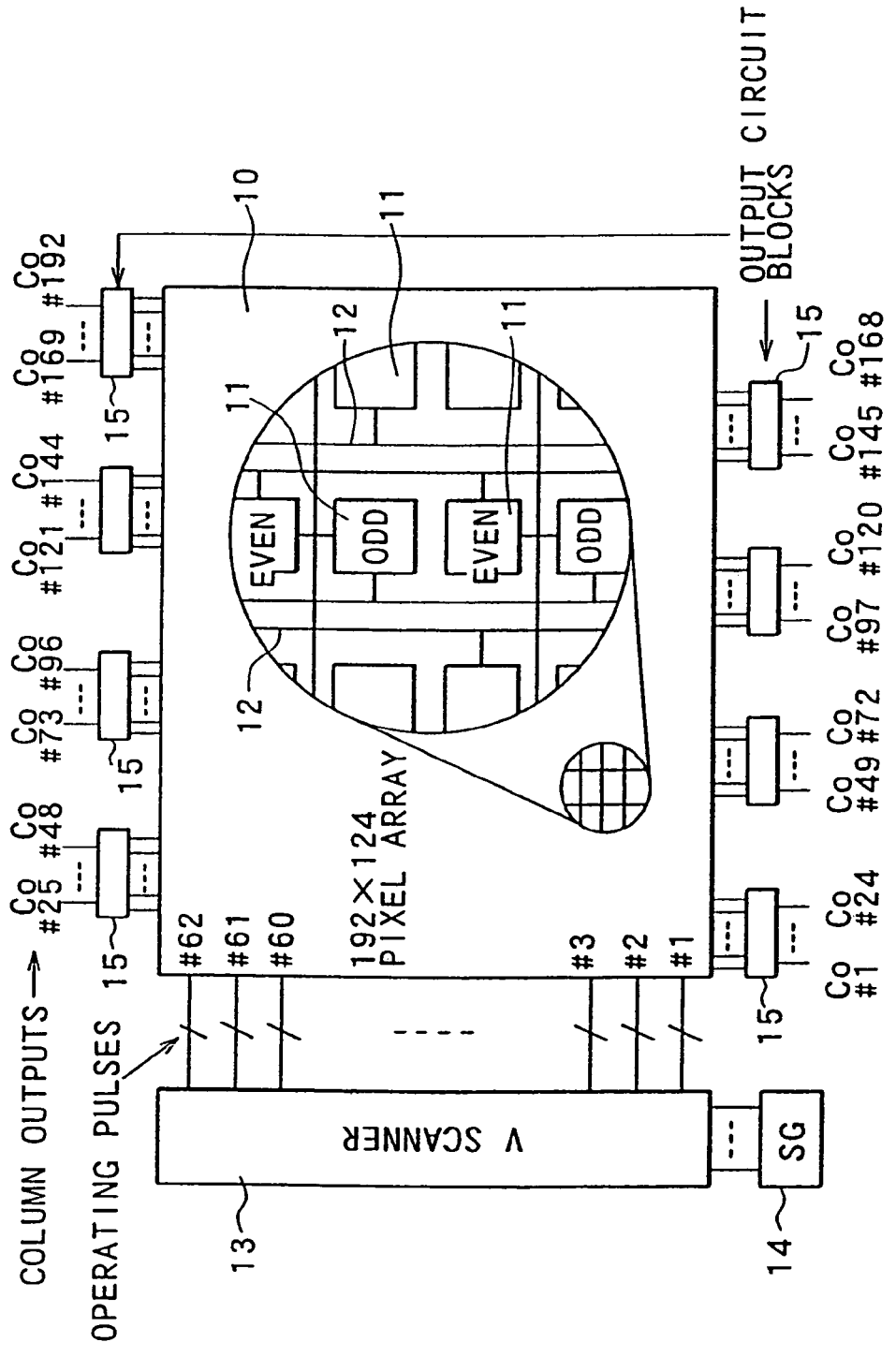
FIG. 7 is a block diagram showing a general configuration of a conventional image sensor.
Figure 8:
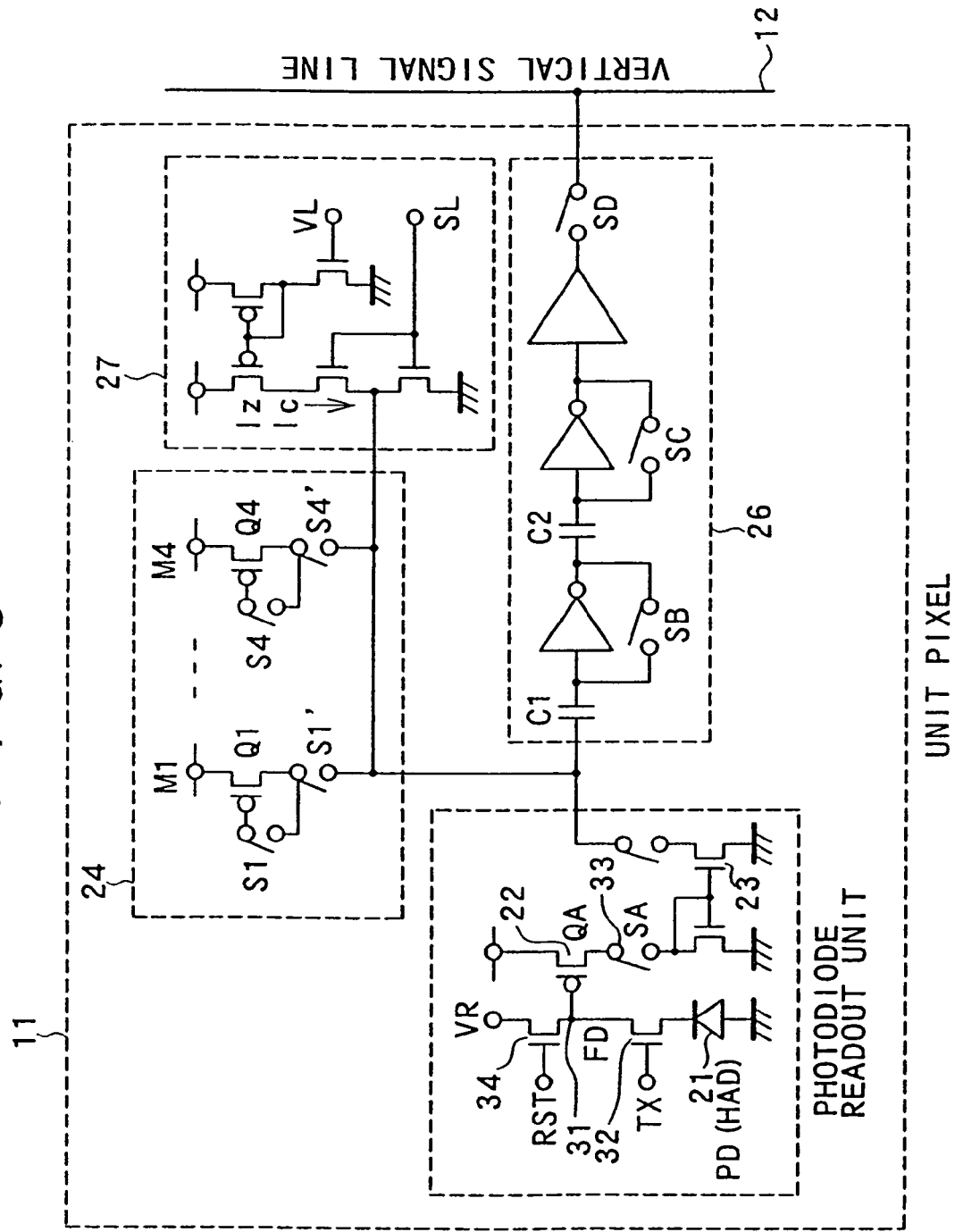
FIG. 8 is a circuit diagram showing an internal configuration of a pixel in the image sensor shown in FIG. 7.
Figure 9:
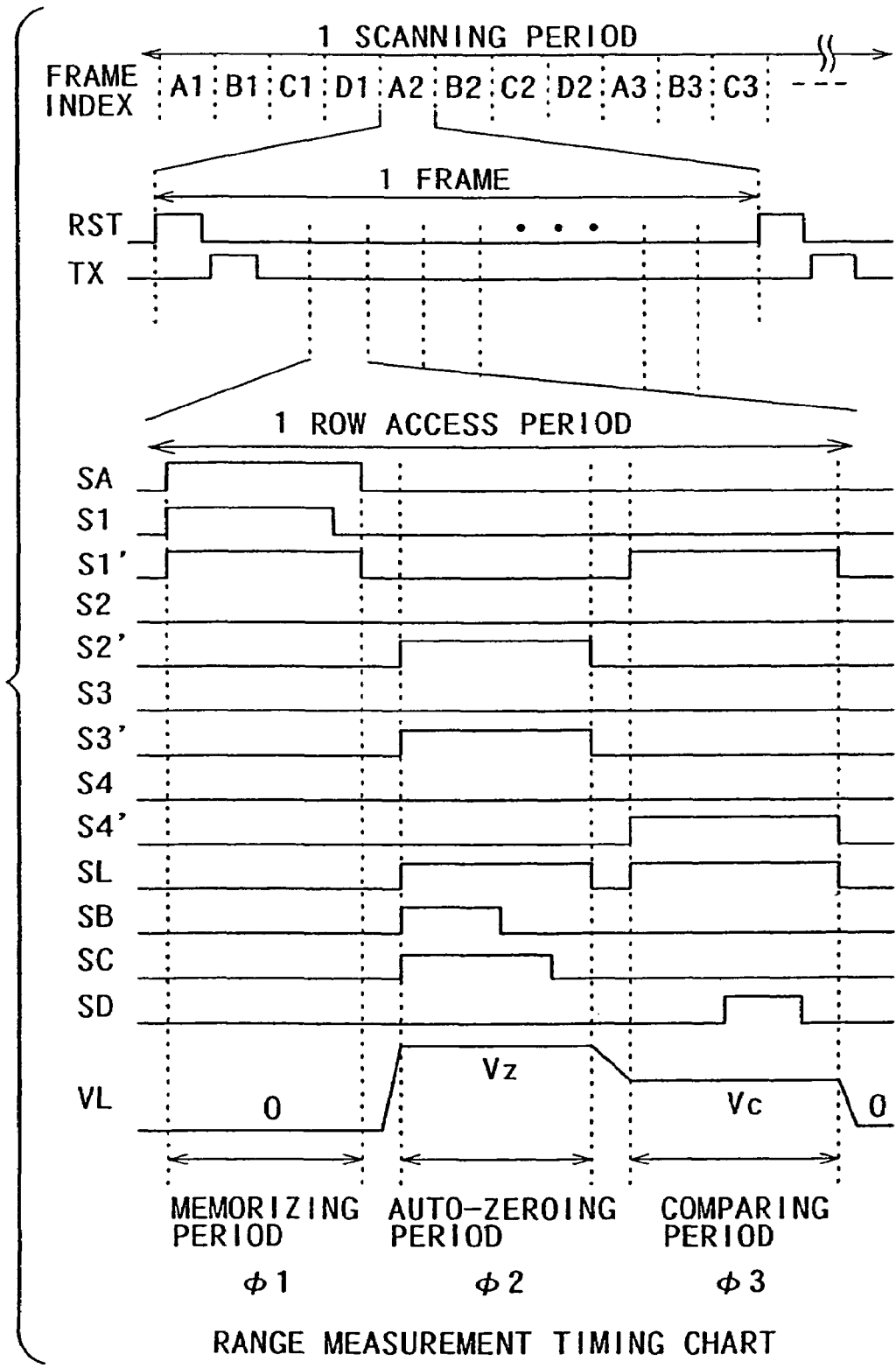
FIG. 9 is a timing chart of range measurement operation by the image sensor shown in FIG. 7.

FIG. 3 is a block diagram showing details of each of the blocks shown in FIG. 1. FIG. 4 is a timing chart of operation at the time of image output. FIG. 5 is a timing chart of operation at the time of range measurement.

The operation at the time of image output will first be described with reference to FIG. 4.

Each switch SW2 in a lower portion of the vertical signal line 54 is turned off by a TSSW signal (low; inactive), so that the signal path is cut off.

First, when the pixel V scanner unit 42 selects a specific row, a one-H period select line (SEL_n) becomes high (active), whereby the selecting transistor 65 is turned on.

Then, a reset pulse is applied to a reset line (TDR_n−1), and the reset transistor 63 resets the FD part 66 to the power supply voltage. At this time, a signal in the reset state is sent out to a signal line (SIG_n).

A transfer gate selecting line (TRG_n) connected to a gate of the transfer selecting transistor 62 becomes high (active) in synchronism with the pixel H scanner unit 43, and at the same time, a transfer selecting line (TDR_n) connected to a drain of the transfer selecting transistor 62 becomes high (active). Thus, the transfer transistor 61 only in the specific pixel is selectively turned on, and a charge in the PD 60 is transferred to the FD part 66.

After completion of the transfer in each pixel, the transfer selecting line (TDR_n) is made low (inactive), and thereafter the transfer gate selecting line (TRG_n) is made low (inactive).

As a result of such an operation, a signal current corresponding to light intensity is sent out to the signal line (SIG_n). The signal current is passed through the horizontal signal line 55 and converted into a voltage signal by the I-V converter circuit unit 44, and then noise rejection is performed from the voltage signal by the CDS circuit unit 45.

The reset signal and the image signal are sequentially transferred to the CDS circuit unit 45. The reset signal and the image signal are clamped by an SHR pulse and an SHD pulse to perform noise rejection.

The operation at the time of range measurement will next be described with reference to FIG. 5.

The three-dimensional measurement is similar to that of the conventional example in that triangulation is performed by detecting passage of a light stripe in each pixel.

At the time of this scanning, unlike the time of image measurement (that is, image output), the switch SW1 in an upper portion of the vertical signal line 54 is turned off, whereby the signal line SIG is disconnected from the horizontal signal line 55.

A video frame period (1 scan period) and a sensor frame period (1 frame) are similar to those in the foregoing conventional example, and a one-line period (1 row access period) is different from that in the conventional example.

FIG. 5 shows scanning in the one-line period. Scanning in the one-H period will be described in the following.

In scanning at the time of range measurement, four pixels constituting color filters (for example Y, G, Cy, and Mg in a case of a complementary color mosaic filter) within the pixel array unit 41 are regarded as one light receiving pixel unit, and signals from the four pixels are added (merged) together for processing. That is, the signals of the four pixels are handled as a signal of one pixel.

As shown below, this is to increase sensitivity to compensate an operating frame rate at the time of range measurement about 100 times faster than at the time of image measurement and hence a shorter light receiving time in each pixel, and also to compensate difference of transmittance of the filters when receiving reflected infrared stripe light at the time of range measurement.

A unit in which the four pixels are regarded as one pixel will hereinafter be described as an ROU (Range Operating Unit) (FIG. 3).

Since the range measurement is column-parallel operation in which reading in all columns is performed at a time, all transfer gate selecting lines TRG in the pixel array unit 41 remain high (active) at all times.

Unlike the time of image measurement, for addition (merging) of the signals from the four pixels, the pixel V scanner unit 42 scans so as to select two rows at the same time.

Specifically, in FIG. 3, SEL_n and SEL_n+1 are selected at the same time. By selecting two specific rows, all pixel selecting transistors 65 in the two rows are turned on.

Thereafter, a pulse is applied sequentially to TDR_n−1, TDR_n, and TDR_n+1.

A TDR line is connected to both a drain of a transfer selecting transistor 62 in a pixel and a gate of a reset transistor 63 on a next line. With the TDR line, charge is transferred from a PD 60, and at the same time, resetting is performed on the next line. That is, in this example, the TDR line is shared by the transfer selecting line and the reset line.

Thus, by first applying a pulse to TDR_n−1, pixels in an nth row are reset. By applying a pulse to a TDR_n line, charge in the pixels in the nth row is transferred, and at the same time, pixels in an (n+1)th row are reset.

By applying a pulse to TDR_n+1, charge in the pixels in the (n+1)th row is transferred. At the same time, pixels in a next (n+2)th row are reset, which has no particular significance in the series of scans (that is, which produces no effects).

Thus, in this example, when reading an image by simultaneously selecting a plurality of rows, the select lines (SEL_n and SEL_n+1) in the plurality of rows are activated, and thereafter an active pulse is sequentially applied to the selecting lines (TDR_n−1, TDR_n, and TDR_n+1) shared by transfer selecting lines and reset lines in increasing order of selected row number.

As a result of the above scanning, charges generated by receiving light are simultaneously transferred to the FD parts 66 of the pixels in the two rows, and signal currents from the amplifying transistors 64 of two pixels simultaneously flow into each signal line. Thus, signal addition for two pixels is performed first.

A resulting current flows into a current mirror circuit 461 simultaneously with the turning on of the CMOS switch SW2 in the lower portion of the signal line. At this time, an odd-numbered column and an even-numbered column are connected to each other in front of the current mirror circuit 461, whereby currents from the two columns flow into the single current mirror circuit 461.

In addition to the simultaneous selection of the two rows, signal addition for four pixels is thereby completed. A resulting current is amplified by the current mirror circuit 461, whereby a current corresponding to the signals is led in through a signal line SIM_(n+1)/2 within the memory array 47.

The analog memory array unit 47 formed by current copier cells has four current copier cells 471 corresponding to one foregoing ROU. The four current copier cells correspond to memories for four sensor frames.

The memory array unit 47 is scanned by the memory V scanner unit 48 in synchronism with the scanning of the pixel array unit 41.

The current copier cells for four frames are arranged in the same manner as the pixel ROU. Therefore, when two rows of the pixel array unit 41 are simultaneously selected, the memory V scanner unit 48 simultaneously selects two rows, which corresponds to selecting a unit of current copier cells for four frames.

This unit of the memory array unit 47 will hereinafter be described as an RMU (Range Memory Unit) (FIG. 3).

At the same time the switches SW2 and SW3 are turned on by the TSSW signal, one line selecting line CCS_n1 is driven high, and thus a selecting transistor 73 of one frame memory in the RMU is turned on.

A current flows from a PMOS transistor 71 forming the memory cell to the current mirror circuit unit 46. At this time, a memory switch transistor 72 within the cell is turned on, and thus the PMOS transistor 71 has a drain and a gate biased to the same potential. Hence, the gate potential is maintained at a potential that is determined according to the current flowing in the cell.

After a steady state is reached in such conditions, a CCM_n1 signal turns off the transistor 72 to isolate the gate and the drain of the transistor 71 from each other, whereby the above gate potential is dynamically stored and retained by the gate of the transistor 71.

The above signal storing phase will be denoted by $\phi 1$.

In next timing, signal comparison between frames is performed to detect passage of a light stripe.

As in the conventional example, the signal comparison between frames subjects signal additions of two temporally preceding frames and two temporally succeeding frames to subtraction, and thus the operation of the (equation 1) is carried out.

In this reading operation, the switches SW2 and SW3 are turned off, and the switch SW4 under the memory array is turned on by a BISW signal. At the same time, selecting lines of two frames to be read in the RMU are driven high.

Thus, current signals read from the memory cells flow into a load transistor 74, and potential of a memory signal line (SGM) is stabilized to a potential determined by current capacity of the load transistor 74 and the PMOS transistors 71 of the memory cells (for two frames).

In order to carry out the (equation 1), memory cell selecting lines CCS_n3 and CCS_n4, for example, are selected simultaneously, whereby the two preceding frames are read simultaneously. Thus, a resulting signal potential is inputted to an input gate of a chopper comparator connected to the vertical signal line 54. Transistor initializing switches TC1 and TC2 of the two-step chopper comparator are sequentially turned on, and the comparator is initialized by the signal potential of the two preceding frames.

Next, in order to read signals of the second two frames, selecting lines CCS_n1 and CCS_n2 are selected simultaneously, currents are sent to the signal line as in the case of the two preceding frames, and a signal potential is determined.

At this time, since the comparator is initialized by the two preceding frames, when the signal potential is greater than that of the two preceding frames, an output of the comparator is high, whereas when the signal potential is not greater than that of the two preceding frames, the comparator outputs a low. Thereby, the (equation 1) is carried out, enabling light detection.

The reading of the first two frames and the reading of the second two frames are shown in $\phi 2$ and $\phi 3$ in the timing chart.

In this case, in order to weight the signals, bias current is supplied from the bias circuit unit 51 in each of $\phi 2$ and $\phi 3$. The bias current is the same as Iz and Ic in the conventional example, and makes it possible to arbitrarily weight the signals from the analog memory array unit 47. As an example, the bias circuit unit 51 uses a source-follower circuit of a PMOS transistor biased by a column-shared current mirror.

In other than the reading operation, the switch SW4 provided between the bias circuit unit 51 and the analog memory array unit 47 is turned off, whereby the bias circuit unit 51 biases the potential of the signal line in a stage preceding the comparator to the power supply voltage.

A selecting signal of each of the switches SW2, SW3, and SW4 and CCM selecting signals in the memory array are subjected to a logical AND with an ADRn signal running vertically in FIG. 3.

When the operation in $\phi 1$ to $\phi 3$ is performed simultaneously in all the columns, there may be an increase in power consumption. Depending on the degree of the increase, proper operation may not be performed as a result of increase in a load on wiring within the elements.

In order to cope with such a situation, the circuit blocks below the SW2 are divided (resulting units will be referred to as divided areas), and the divided areas are scanned serially, so that a concentrated increase in power consumption is prevented.

In the timing chart of FIG. 5, a case where the whole of the circuit blocks is divided into four areas is assumed. A divided area is selected by the ADRn signal, and thus the operation in $\phi 1$ to $\phi 3$ is performed in each of the divided areas 1 to 4.

As described above, in this example, when reading signals from the pixel array 41 in column parallel and performing arithmetic processing in each column, arithmetic areas are formed by a plurality of columns, and the arithmetic processing is performed serially in each of the arithmetic areas. Thus, an appropriate arithmetic operation in which loads are taken into consideration is possible.

Each of the arithmetic areas is selected by the address line. The switches in stages preceding and succeeding the current mirror unit, a memory switch line, a switch in a stage succeeding the comparator, a line for selecting the load transistor of the signal line, a comparator initializing line, and an enable line of the data latch are operated by the address line only at a time when the area is selected.

The two foregoing operations of the image measurement (image output) and the range measurement can be performed independently of each other and continuously in different time periods, or may be alternated at intervals of an arbitrary number of video frames such as one video frame.

In this case, the image sensor alternately outputs image information and range information, thus enabling real-time image processing that combines the image information and the range information.

The above operations can be selected as required by an externally inputted mode selecting signal MSL, for example.

The image sensor in this example can perform various other image processing operations than the range measurement by circuit architecture for the range measurement.

An example of the image processing operations is motion detection.

This is a function of extracting only a moving object within an imaging screen by performing basically the same operation as the range measurement. In the range measurement a difference between temporally successive frames is calculated at all times. Thus, when there is a moving object in the image, as in detection of a light stripe, timing in which signal strength of the latter frames exceeds signal strength of the first frames occurs in the inter-frame difference operation of the comparator.

Thus, detection of the timing enables detection of the moving object.

In the case of the motion detection, high-speed scanning of sensor frames as in the range measurement is not required; in view of detection sensitivity, the frame rate can be reduced to a video frame rate at the lowest level.

In addition, with the above-described circuit configuration, image information can be outputted in a digital form. A method for this is basically the same as the image output method of the conventional example, and uses the analog memory array unit 47 and the comparator unit 50.

While at the time of range measurement in the operation example described above, two lines are read simultaneously for four-pixel addition, lines are scanned one by one in the digital image output using the analog memory array unit 47 and the comparator unit 50.

Also, rather than turning on the odd-numbered column and the even-numbered column simultaneously, the switch SW2 separately turns on the odd-numbered column and the even-numbered column by a SEL_ODD signal and a SEL_EVEN signal, respectively. That is, the reading of the odd-numbered column and the reading of the even-numbered column are performed separately in a one-H period.

In this case, in the operation of reading each column, two frame memories can be made to correspond to one pixel. Hence, when one frame memory is used to retain a reference signal and the other frame memory is used to retain an image signal, the reference signal and the image signal can be successively compared with each other by the integral charge accumulation of the conventional example to thereby provide an image signal.

As another method for image output, in the one-H period, the reference signal is read to initialize the comparator unit 50 as in the above, thereafter the image signal is read and sent to the comparator unit 50, and then the bias current is ramped, so that a level at which digital data is inverted is detected and thus image information can be extracted.

Furthermore, detection of an edge of an image is also made possible by circuit modification.

Instead of only one column for one comparator input as described above, by enabling an input from an adjacent column by switch selection, level of a signal from an adjacent pixel can be compared.

Thus, only a part of great signal change in image information can be extracted, that is, an edge can be detected.

In addition, various filter processing and smoothing processing using filters can be performed.

As described above, in the image sensor in this example, the arithmetic circuit, which is retained by each pixel in the image sensor described in the conventional example, is shared by each column. Also, the image sensor performs image output processing and arithmetic processing completely separately by different circuit blocks. It is thereby possible to simplify configuration within each of the pixels, reduce size of the apparatus as a whole, achieve higher image quality of an actual image, and make optimum design for arithmetic processing.

For example, the order of scanning the pixels is changed between the normal image output and arithmetic processing, so that optimum processing can be performed.

As to the order of scanning the pixels, serial processing in a unit of one pixel or in a unit of a block of a small number of pixels and parallel processing using a plurality of signal lines can be properly used. For example, serial processing in a unit of one pixel can be performed at the time of image information output processing, whereas parallel processing using a plurality of signal lines can be performed at the other time of arithmetic processing. Thus, optimization to suit characteristics of each signal processing is possible.

In addition, the number of pixels transmitted simultaneously to a single signal line can be changed; at the time of image information output processing, a signal of one pixel is transmitted to the signal line, whereas at the other time of arithmetic processing, signals of a plurality of pixels are transmitted simultaneously to the single signal line. Thus, optimization to suit characteristics of each signal processing becomes possible.

Also, a number of pixels corresponding to a combination of color filters is used as the number of pixels transmitted simultaneously to the single signal line at the time of arithmetic processing. Thus, high-precision arithmetic becomes possible.

In addition, in the above example, a TDR line is shared by a transfer selecting line disposed in a certain row and a reset line disposed in the next row. Thus, it becomes possible to reduce wiring space and size of the apparatus.

Moreover, in the above example, switches are provided each for one or a plurality of columns of the pixel array, a switch to be turned on at the time of signal reading is selected from the switches, and thereby columns for input to individual current mirror circuits are selected. In addition, a plurality of rows or a plurality of columns within the pixel array are selected simultaneously to merge and add signals of a plurality of pixels together and thus handle the plurality of pixels as one light receiving pixel unit. It is thereby possible to employ a method specific to the arithmetic processing. Thus, optimization is possible.

Furthermore, in the above example, to compare a result of addition of a combination of two frames or more among a plurality of frames corresponding to one light receiving pixel unit in the analog memory array unit 47, memory cells corresponding to the frames are arranged in a matrix manner with a signal line in between, and cells arranged at opposite poles with the signal line in between are selected for the combination of frames at all times. Also, selection of a plurality of rows by the scanner of the pixel array 41 at the time of selecting one light receiving pixel unit is synchronized with selection of a plurality of rows by the scanner of the analog memory array unit 47 at the time of selecting a unit of a plurality of frames.

Thus, high-precision and high-efficiency signal processing becomes possible.

A second embodiment of the present invention will next be described.

The solid-state image pickup apparatus according to the first embodiment as described above realizes functions of normal color image output and three-dimensional range measurement based on a light-section method. The method of three-dimensional range measurement can be realized by the conventional configuration described with reference to FIG. 6A.

Specifically, a light source emitting a stripe of light and a scanning mirror are disposed in the vicinity of a sensor (light receiving unit). A subject is irradiated with the stripe of light via the mirror while scanning the scanning mirror. Range information for each point of the subject can be obtained from a relation between timing in which each pixel of the sensor receives the stripe of light reflected from the subject and a scan angle of the mirror on principles of triangulation.

In this case, however, many parts such as the light source, an optical device for generating the stripe of light, the mirror, a driving system for scan operation and the like are required outside the sensor. It is therefore not easy to reduce size of the apparatus or save power. A cylindrical lens as the optical device for generating the stripe of light would be required to satisfy optical conditions. It is therefore not easy to reduce size of the lens.

Accordingly, in the second embodiment of the present invention, a mirror unit performing scan operation in a system for three-dimensional range measurement by the light-section method is formed by a MEMS (Micro Electro Mechanical System) mirror. Thus, a simple small system is realized, and power consumption is reduced.

Figure 10:
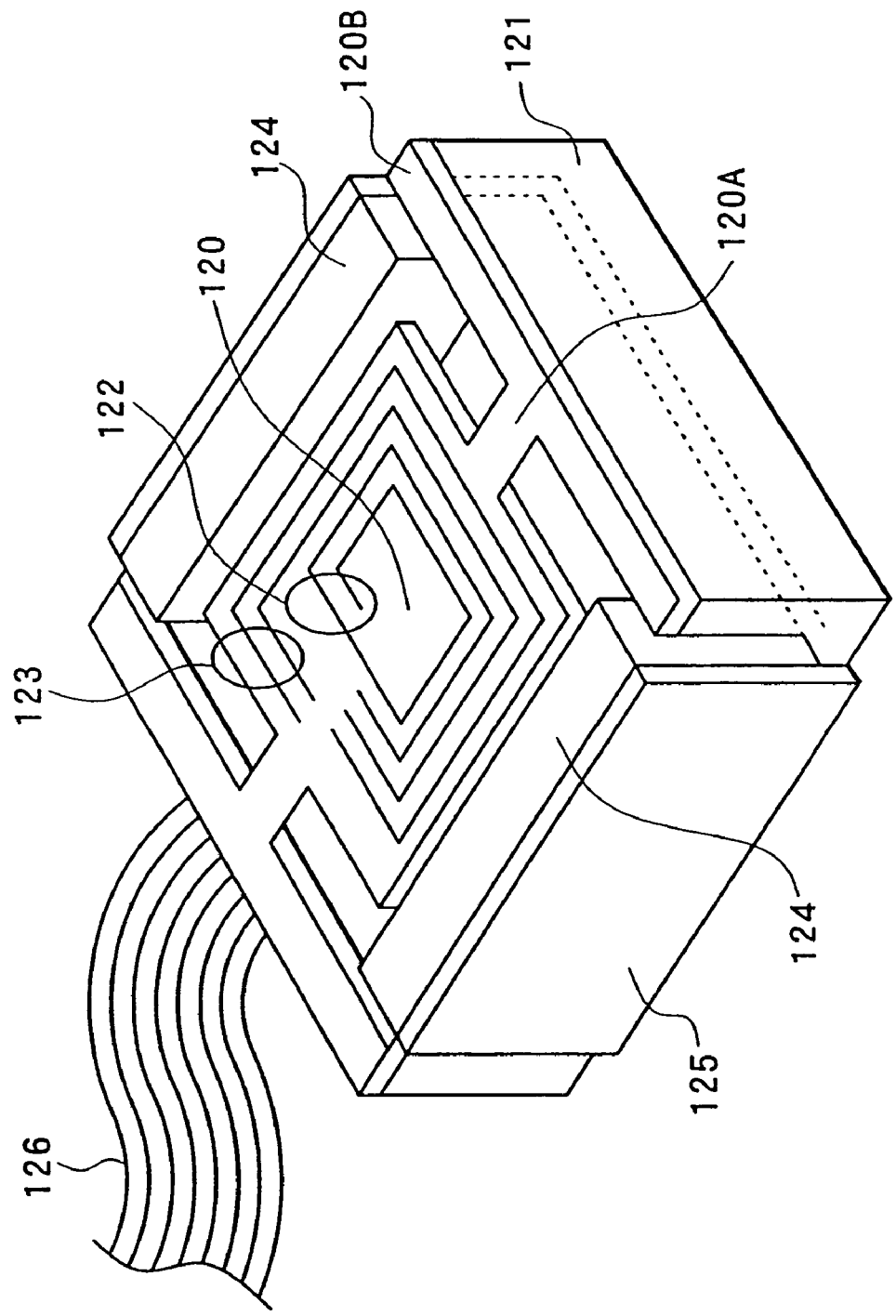
FIG. 10 is a perspective view of an example of structure of a MEMS mirror used in a three-dimensional range measurement system according to a second embodiment of the present invention.

FIG. 10 is a perspective view of an example of structure of the MEMS mirror used in the three-dimensional range measurement system according to the second embodiment of the present invention.

The MEMS mirror shown in FIG. 10 is a scanner mirror of an electromagnetic driving type formed on a silicon substrate (see "Hiroshi Miyajima, Journal of Microelectromechanical Systems Vol. 10, No. 3 2001 p418-p424," for example).

The MEMS mirror is formed by attaching a moving plate (mirror body) 120 having a mirror surface formed on a surface of the silicon substrate to a metal base 121. A fixed piece 120B is formed on both sides of the moving plate 120 with a hinge portion 120A in between. The fixed piece 120B is joined to the metal base 121. Thus, using flexibility and elasticity of the hinge portions 120A, the moving plate 120 is rotatable.

In the metal base 121, a sensing coil 122 and a driving coil 123 are disposed on a backside of the moving plate 120. Magnets 124 and a yoke 125 are disposed so as to sandwich the moving plate 120.

A current is passed through the driving coil 123 via a flat cable 126 or the like. A displacement of the moving plate 120 is detected by a detection signal of the sensing coil 122, and a value of the current to the driving coil 123 is controlled. Thus, using a balance between Lorentz force and torsional stress of the hinge portions, the moving plate (mirror surface) 120 is allowed to perform scan operation.

Incidentally, vibration frequency of the mirror, swing angle of the mirror, and starting and stopping of the operation can be controlled externally.

In addition, the example shown in FIG. 10 can select two driving modes: a galvanometric driving mode in which the swing angle of the mirror surface is controlled statically by adjusting the current in amount; and a resonant driving mode in which the vibrating operation of the mirror surface and an external control signal are synchronized with each other to thereby cause resonant operation and hence the scan operation of the mirror surface.

By forming the hinge portions 120A of the moving plate 120 of thin polyimide films, it is possible for the MEMS mirror to perform low-frequency scan operation, which is difficult for an ordinary silicon hinge to achieve.

A conventional scanning mirror used in the light-section method has problems of large parts size and high power consumption because a driving unit such as a galvano-motor and a mirror are formed separately. In this example, as shown in FIG. 10, the system as a whole for the light-section method can be reduced in size by using the MEMS mirror, in which the mirror and the driving unit are formed integrally with each other.

It is to be noted that while this example uses a scanner of an electromagnetic driving type as an example of the MEMS mirror, scan operation using thermal expansion of hinge material by passing a current through the mirror hinge portion, or scan operation using difference in thermal expansivity between layered films forming the hinge may be performed as another driving method.

Furthermore, with a MEMS type mirror in which a mirror and a unit for driving the mirror are formed integrally with each other on the same substrate, the system for the light-section method can be similarly reduced in size.

Furthermore, since the MEMS mirror is generally formed on a semiconductor substrate, a light source for irradiating the scanning mirror such as a laser, an LED or the like can be formed integrally with the MEMS mirror on the same substrate.

A third embodiment of the present invention will next be described.

FIGS. 11A and 11B are diagrams of assistance in explaining two configuration examples of a three-dimensional range measurement system according to the third embodiment of the present invention.

The system for the light-section method in this example uses a laser hologram 100 in a light projecting unit for providing a stripe of light.

The laser hologram is commercialized and used as an AF light source of a digital still camera, for example. As shown in FIGS. 11A and 11B, the laser hologram is disposed in a path of light emitted from a laser light source 101, and controls laser light into a stripe of light and supplies the stripe of light to an object 102.

Light reflected from the object 102 is passed through a lens 111 and then shot by a sensor 110 as described in the first embodiment, whereby three-dimensional range measurement is performed.

It is to be noted that while in this example, the same mirror scanner (scanner mirror) 103 as in the example shown in FIG. 6A scans laser light, the MEMS mirror shown in FIG. 10 can also be used.

By using the laser hologram 100, that is, by only adding a small optical system (hologram element) to the laser light source 101, a light stripe can be generated. In addition, since the hologram element is formed by an inexpensive plastic substrate, the hologram element is advantageous also in terms of cost.

The laser hologram 100 may be disposed between the laser light source 101 and the mirror scanner 103, as shown in FIG. 11A, or may be disposed in a stage succeeding the mirror scanner, as shown in FIG. 11B.

When the laser hologram 100 is disposed in the stage succeeding the mirror scanner 103, spotlight emitted from the laser light source 101 is scanned by the mirror, and then spread into a stripe.

As a fourth embodiment of the present invention for simplifying the light source, the same sensor as in the first embodiment is used and a light source such as an LED or the like is used as the light source. Instead of scanning by the mirror, the fourth embodiment can be configured to calculate a difference between frames picked up when the LED is turned on and when the LED is turned off, so that an object in the foreground against the background can be recognized.

Incidentally, with this configuration, rough range measurement can be performed by effecting control such as changing intensity of light of the LED.

Examples of application of the foregoing embodiments will next be described.

An imaging system formed by the solid-state image pickup apparatus according to each of the foregoing embodiments can be used to realize image processing, image recognition, and other functions that have been conventionally difficult to realize with various IT apparatus and the like as mentioned below.

FIRST APPLICATION EXAMPLE

In this example, the system for the light-section method according to the foregoing first to fourth embodiments is used to effect control to extract an image in a certain distance range from an image on the basis of range information.

For example, this control is effected to cut out only an image of an object at a shorter distance from the sensor and eliminate an image portion in the background. This function makes it possible to extract only an image of a person talking or a person being spoken to in the foreground in image communication on a portable telephone, a portable terminal (PDA), a videophone, a videoconference or the like. The function can be used to conceal private information or the like by deleting information such as a location of the person being spoken to or the like. Furthermore, when an image to be transmitted is limited to only a cut-out image, the function can be used to reduce an amount of information of the image to be transmitted.

In addition, with the above function, a different background can be used in place of the deleted background. Specifically, a landscape obtained separately or the like is used as the background, and thus the background can be changed according to personal preference. In this case, range information of the cut-out object and the background facilitates image superimposition.

The processing of extracting a particular image can be used as preprocessing of image recognition and object recognition processing. For example, face recognition processing generally requires an operation of extracting an image of a face portion from the background as preprocessing before an operation of recognizing the face portion. Since an ordinary extracting operation uses only image information, the extracting operation has not been easy, taking a long processing time and the like; however, the processing of cutting out the face portion or the like can be readily performed by using the above system.

Incidentally, in this example, although the LED irradiation system described in the fourth embodiment can be used to realize a similar function, it is difficult for the LED irradiation system to effect fine control according to range information because of poorer range accuracy of the LED irradiation system.

SECOND APPLICATION EXAMPLE

In this example, two systems for the light-section method as shown in the foregoing first to fourth embodiments are used to combine two images according to range information. Specifically, the two systems for the light-section method as shown in the foregoing first to fourth embodiments are used to effect control to display an image in the foreground of two images at all times.

This for example makes it possible to virtually arrange an ornament, which is disposed at a different place, on a table in a room on the screen as a virtual space simulation. Also, it is possible to obtain on a real-time basis an image in which a person virtually moves in a room and hides behind an object, for example. These examples can be applied to simulation of interior arrangements, interaction (interactive battle type) games and the like.

In addition, a user interface can be constructed by reflecting a keyboard, various buttons and the like and a manually generated image on the screen.

Furthermore, some applications allow operation such as displaying an image in the background rather than displaying only an image in the foreground, and thus allow operation such as making visible a thing originally invisible.

In this example, the number of systems is not limited to two; three or more systems can combine images. This example not only performs real-time combining processing but is also capable of variations such as control using a plurality of images recorded in advance, combining a recorded image with an image obtained on a real-time basis, and the like.

THIRD APPLICATION EXAMPLE

In this example, image information and range information of the system for the light-section method as shown in the foregoing first to fourth embodiments are used in operation feedback control on various apparatus and robots.

For example, it is possible to automatically control an apparatus according to range information of an image in remote control operation in telemedicine.

Also, when an apparatus performs some operation for an object appearing in an image, a space in which the apparatus is allowed to operate can be limited so that the apparatus does not contact the object, for example.

In addition, when the system is incorporated into an autonomous robot or the like, the robot can generate a map of the environment of a room by detecting and storing information on an arrangement of furniture in the room and the like. The map can be used as basic data information for the robot to move or work in the room.

FOURTH APPLICATION EXAMPLE

In this example, the system for the light-section method as shown in the foregoing first to fourth embodiments is used to recognize motion of an object and gesture by analyzing range information of an object on a time axis.

The system as shown in the foregoing first to fourth embodiments can obtain three-dimensional range information in real time. Thus, by analyzing change in the position of the object in a direction of a time axis and analyzing characteristics of the motion, the system can recognize a pattern (gesture) of the human motion.

This can be used to enable user interface techniques using gesture, for example. The user interface techniques can be used for user interfaces of personal computers (PC), games, robots, various AVs, IT apparatuses and the like.

In addition, the gesture recognition can be combined with information obtained from a normal image to increase objects for recognition and efficiency of recognition.

FIFTH APPLICATION EXAMPLE

In this example, information on natural projections and depressions is used for object recognition, personal recognition, or security purposes.

For example, for a security purpose involving personal authentication, information on shape of the face of a person is registered in advance for recognition, and when an unidentified person comes thereafter, information on projections and depressions of the face of the person is compared with the information on the projections and depressions of the preregistered person to determine coincidence of the information and thereby identify the person. In this case, since the sensor system according to the foregoing first to fourth embodiments can obtain a normal image simultaneously, this personal authentication can be combined with personal authentication through image recognition as in the first application example.

This personal authentication is not limited to the face, and can be performed using various parts of the body.

Also, the sensor system according to the foregoing first to fourth embodiments can detect motion and recognize gesture through analysis in the direction of the time axis, as illustrated in the fourth application example. Thus, the gesture can be used for personal authentication.

Moreover, such authentication using projections and depressions can be used to identify not only persons but also ordinary objects.

Furthermore, instead of being used as accurate data for identification and authentication as described above, information on projections and depressions of parts of subjects can be analyzed as characteristics of the projections and depressions, for example characteristics of the texture, and thus used as data for identification and authentication.

SIXTH APPLICATION EXAMPLE

In this example, the system for the light-section method as shown in the foregoing first to fourth embodiments is used to check the rear and outside of a motor vehicle.

In checking the rear of a motor vehicle, for example, steering operation is performed while viewing a normal image provided by the sensor, and at the same time, the system measures a distance to an obstacle in the rear and issues a warning when the vehicle comes near to a certain distance to the obstacle.

Also, by setting a mark formed by projections and depressions on an ordinary road or the like and reading the mark by the sensor system included in an individual vehicle, it is possible to apply the sensor system to automatic control feedback of the motor vehicle or the like. For example, a system can be constructed in which a mark formed by projections and depressions is set on a side portion of a road, the motor vehicle travels while reading the mark, and a warning is issued when the motor vehicle is deviating from the road.

SEVENTH APPLICATION EXAMPLE

In this example, the system for the light-section method as shown in the foregoing first to fourth embodiments is used inside a motor vehicle.

For example, the three-dimensional measuring function is used to determine presence of a person in a seat, age of a sitting person and the like. Results of such detection can be fed back to issue a warning to wear a seat belt, adjust operating level of an air bag, for example.

Also, a gesture recognition function as in the fourth application example is used so that a driver can control a device included within the vehicle by gesture without touching buttons or the like of the device.

EIGHTH APPLICATION EXAMPLE

In this example, the system for the light-section method as shown in the foregoing first to fourth embodiments is used for real-time three-dimensional modeling.

Since the system according to the first embodiment can obtain a normal image and perform three-dimensional measurement substantially simultaneously, the system is capable of three-dimensional modeling of an object and texture mapping by cutting and pasting images. These processes can be carried out in real time.

NINTH APPLICATION EXAMPLE

As a ninth application example, the system for the light-section method as shown in the foregoing first to fourth embodiments can be used for object separation processing of MPEG4.

As described above, a solid-state image pickup apparatus according to the present invention transmits an image signal obtained by an imaging pixel in a first signal transmitting path and a second signal transmitting path of a signal line, and performs different signal processing operations by means of a first signal processing unit and a second signal processing unit. Thus, normal image signal output and various other arithmetic processing, for example, can be performed by the separate circuits.

In addition, a control method according to the present invention transmits an image signal obtained by an imaging pixel in a first signal transmitting path and a second signal transmitting path of a signal line, and performs different signal processing operations in a first signal processing step and a second signal processing step. Thus, normal image signal output and various other arithmetic processing, for example, can be performed by different circuits.

Therefore, circuit elements required for each of the signal processing operations can be arranged together outside pixels, so that a configuration within each of the pixels can be simplified and minimized. Also, it is possible to enhance the function of obtaining a normal actual image and the computational function for executing various applications by their respective independent circuit configurations. It is thus possible to achieve smaller apparatus size; lower power consumption, lower cost, an increase in the number of pixels of an actual image (higher image quality) and the like.

What is claimed is:
1. A solid-state image pickup apparatus comprising:
a plurality of light receiving units each forming an imaging pixel;
a plurality of photoelectric conversion units for converting light received by said light receiving units into electric signals;
a signal line having a plurality of signal transmission paths for extracting the electric signals converted by said plurality of photoelectric conversion units;

a first signal processing unit for processing the electric signals transmitted in a first signal transmitting direction through said signal line; and a second signal processing unit for processing the electric signals transmitted in a second signal transmitting direction through said signal line;

wherein the signal processing performed by said first signal processing unit and the signal processing performed by said second signal processing unit are different from each other;

wherein the plurality of light receiving units have a plurality of photodiodes.

2. A solid-state image pickup apparatus as claimed in claim 1, wherein said first signal processing unit performs image information output processing, and said second signal processing unit performs arithmetic processing for executing a predetermined application using output signals from said photoelectric conversion units.

3. A solid-state image pickup apparatus as claimed in claim 1, further comprising a switch for blocking a signal transmission path in said second signal transmitting direction when said first signal processing unit performs the signal processing and blocking a signal transmission path in said first signal transmitting direction when said second signal processing unit performs the signal processing.

4. A solid-state image pickup apparatus as claimed in claim 1, wherein the signal processing by said first signal processing unit and the signal processing by said second signal processing unit are selected by an external selecting signal.

5. A solid-state image pickup apparatus as claimed in claim 1, wherein at a time of non-operation of said first signal processing unit and said second signal processing unit, part or all of the operation is stopped.

6. A solid-state image pickup apparatus as claimed in claim 1, wherein order of scanning pixels is changed between the signal processing by said first signal processing unit and the signal processing by said second signal processing unit.

7. A solid-state image pickup apparatus as claimed in claim 6, wherein as the order of scanning said pixels, serial processing in a unit of one pixel or a block unit of a small number of pixels and parallel processing using a plurality of signal lines are used.

8. A solid-state image pickup apparatus as claimed in claim 7, wherein serial processing in a unit of one pixel is performed at a time of image information output processing, and parallel processing using a plurality of signal lines is performed at a time of other arithmetic processing.

9. A solid-state image pickup apparatus as claimed in claim 1, wherein a number of pixels transmitted simultaneously to a single signal line is changed between the signal processing by said first signal processing unit and the signal processing by said second signal processing unit.

10. A solid-state image pickup apparatus as claimed in claim 9, wherein a signal of each pixel is separately transmitted to the signal line at a time of image information output processing, and signals of a plurality of pixels are simultaneously transmitted to the single signal line at a time of other arithmetic processing.

11. A solid-state image pickup apparatus as claimed in claim 10, wherein a number of pixels corresponding to a combination of color filters is used as a number of pixels simultaneously transmitted to the single signal line at the time of said arithmetic processing.

12. A solid-state image pickup apparatus as claimed in claim 1, wherein each of pixels includes: said light receiving unit; said photoelectric conversion unit; a transfer transistor for transferring a signal charge from said photoelectric conversion unit; a transfer selecting transistor for selecting said transfer transistor; an amplifying transistor for amplifying the signal charge transferred by said transfer transistor and converting the signal charge into an electric signal; a reset transistor for resetting the signal charge supplied to said amplifying transistor; and a selecting transistor for selecting the pixel.

13. A solid-state image pickup apparatus as claimed in claim 12, wherein said pixels are arranged in a row direction and a column direction in a two-dimensional matrix form within a pixel array.

14. A solid-state image pickup apparatus as claimed in claim 13, wherein the selecting transistor of each of said pixels in each column is selected collectively by a selecting line arranged in the row direction, and said signal line is arranged in the column direction.

15. A solid-state image pickup apparatus as claimed in claim 14, wherein a transfer selecting line for transmitting a signal charge transfer pulse to said transfer selecting transistor and a reset line for transmitting a reset pulse to said reset transistor are arranged in parallel with a row.

16. A solid-state image pickup apparatus as claimed in claim 15, wherein said transfer selecting line is arranged in a certain row, and is also used as said reset line arranged in a next row.

17. A solid-state image pickup apparatus as claimed in claim 16, wherein said transfer selecting transistor has a drain electrode connected to said transfer selecting line arranged in parallel with the row and a gate electrode connected to a transfer gate selecting line arranged in parallel with a column.

18. A solid-state image pickup apparatus as claimed in claim 17, wherein as timing of image reading in a pixel arrangement in said two-dimensional matrix form, said transfer selecting line and said transfer gate selecting line are activated simultaneously at a time of charge transfer, and after completion of the transfer, said transfer selecting line is inactivated, and then said transfer gate selecting line is inactivated.

19. A solid-state image pickup apparatus as claimed in claim 18, wherein when column-parallel operation is performed in said pixel arrangement, said transfer gate selecting line is activated at all times.

20. A solid-state image pickup apparatus as claimed in claim 18, wherein in simultaneously reading pixels in a plurality of columns in said pixel arrangement, selecting lines in a plurality of rows are activated, and thereafter an active pulse is sequentially applied to selecting lines shared by transfer selecting lines and reset lines in increasing order of selected row number.

* * * * *